(12) United States Patent
Sasaki et al.

(10) Patent No.: US 7,067,965 B2
(45) Date of Patent: Jun. 27, 2006

(54) PIEZOELECTRIC PORCELAIN COMPOSITION, PIEZOELECTRIC DEVICE, AND METHODS OF MAKING THEREOF

(75) Inventors: Satoshi Sasaki, Akita (JP); Kenji Koseki, Akita (JP)

(73) Assignee: TDK Corporation, Tokyo (JP)

( * ) Notice: Subject to any disclaimer, the term of this patent is extended or adjusted under 35 U.S.C. 154(b) by 219 days.

(21) Appl. No.: 10/663,811

(22) Filed: Sep. 17, 2003

(65) Prior Publication Data

US 2004/0222719 A1 Nov. 11, 2004

(30) Foreign Application Priority Data

Sep. 18, 2002 (JP) .................... P2002-272037
Mar. 31, 2003 (JP) .................... P2003-096661

(51) Int. Cl.
*H01L 41/187* (2006.01)

(52) U.S. Cl. ............. 310/358; 204/192.18; 501/134; 501/136

(58) Field of Classification Search ............. 310/358; 204/192.18; 501/134–136; 252/69.2 PZ
See application file for complete search history.

(56) References Cited

U.S. PATENT DOCUMENTS

| | | | | |
|---|---|---|---|---|
| 3,649,353 A * | 3/1972 | Ulrich | | 427/542 |
| 4,041,140 A * | 8/1977 | Nitta et al. | | 264/643 |
| 5,935,485 A * | 8/1999 | Tani et al. | | 252/62.9 PZ |
| 5,954,993 A * | 9/1999 | Horikawa et al. | | 252/62.9 PZ |
| 6,100,578 A * | 8/2000 | Suzuki | | 257/627 |
| 6,194,818 B1 * | 2/2001 | Sumi et al. | | 310/311 |
| 6,229,159 B1 * | 5/2001 | Suzuki | | 257/84 |
| 6,402,981 B1 * | 6/2002 | Sasaki | | 252/62.9 PZ |
| 6,734,607 B1 * | 5/2004 | Nagaya et al. | | 310/363 |
| 6,747,317 B1 * | 6/2004 | Kondo et al. | | 257/347 |
| 6,884,649 B1 * | 4/2005 | Kobayashi et al. | | 438/50 |
| 2002/0030723 A1 * | 3/2002 | Sumi et al. | | 347/68 |
| 2002/0146893 A1 * | 10/2002 | Shimoda et al. | | 438/458 |
| 2003/0169574 A1 * | 9/2003 | Maruyama et al. | | 361/760 |
| 2004/0026030 A1 * | 2/2004 | Hatono et al. | | 156/279 |
| 2004/0110309 A1 * | 6/2004 | Tseng et al. | | 438/3 |
| 2005/0236654 A1 * | 10/2005 | Kijima et al. | | 257/295 |

FOREIGN PATENT DOCUMENTS

| | | |
|---|---|---|
| JP | A 5-24917 | 2/1993 |
| JP | A 9-2872 | 1/1997 |
| JP | A 10-7461 | 1/1998 |
| JP | A 10-139540 | 5/1998 |
| JP | A 10-231169 | 9/1998 |
| JP | A 10-316467 | 12/1998 |
| JP | A 11-163433 | 6/1999 |
| JP | A 11-168248 | 6/1999 |
| JP | A 2000-211968 | 8/2000 |
| JP | A 2001-58872 | 3/2001 |
| JP | A 2002-255646 | 9/2002 |

* cited by examiner

*Primary Examiner*—Darren Schuberg
*Assistant Examiner*—J. Aguirrechea
(74) *Attorney, Agent, or Firm*—Oliff & Berridge, PLC

(57) ABSTRACT

A piezoelectric porcelain composition containing a complex oxide having a perovskite structure mainly composed of Pb, Zr, and Ti; and the following component (a) and/or (b), or component (A) and/or (B):

(a) Ag and/or an Ag compound, and Mo and/or an Mo compound
(b) silver molybdate [$Ag_2MoO_4$]
(A) Ag and/or an Ag compound, Mo and/or an Mo compound, and W and/or a W compound
(B) silver molybdate-tungstate [$Ag_2Mo_{(1-x)}W_xO_4$] (where X is a number from 0.3 to 0.7)

28 Claims, 6 Drawing Sheets

PIEZOELECTRIC PORCELAIN COMPOSITION, PIEZOELECTRIC DEVICE, AND METHODS OF MAKING THEREOF

BACKGROUND OF THE INVENTION

1. Field of the Invention

The present invention relates to a piezoelectric porcelain composition suitable for laminated actuators, piezoelectric buzzers, sounding bodies, sensors, and the like, a piezoelectric device using the same, and methods of making them.

2. Related Background Art

Recently, as apparatus involving application of piezoelectric devices, those using a laminated device in which piezoelectric porcelain layers and inner electrode layers are alternately laminated, such as a laminated piezoelectric actuator, have been developed vigorously.

As such piezoelectric devices, those constituted by piezoelectric porcelain compositions have often been in use. For example, piezoelectric porcelain compositions such as those of $Pb(Ni_{1/3}Nb_{2/3})ZrO_3$ type and $Pb(Mg_{1/3}Nb_{2/3})(Ni_{1/3}Nb_{2/3})TiZrO_3$ type which are piezoelectric porcelain compositions containing complex oxides mainly composed of Pb, Zr, Ti have been known.

Piezoelectric porcelain compositions having lowered their firing temperature by adding specific substances to complex oxides have also been proposed. Specifically, piezoelectric porcelain compositions where Ag or Ag oxides is added, those where $MoO_3$ is added, and the like have been known.

It has also been known that characteristics of piezoelectric porcelain compositions can be improved when metals, alloys, compounds, and the like of Ag are added to the compositions.

SUMMARY OF THE INVENTION

The piezoelectric actuator, which is an example of laminated piezoelectric devices employing a piezoelectric porcelain composition, has such a characteristic that a large displacement can be obtained with a small electric field, and is also advantageous in that the device can easily be made smaller, and so forth. Such a laminated piezoelectric device is usually made by laminating a piezoelectric layer made of a piezoelectric porcelain composition and an inner electrode together and firing thus obtained laminate. When a piezoelectric porcelain composition whose firing temperature exceeds 1200° C. is employed, an expensive noble metal such as platinum (Pt) and palladium (Pd) which can endure such a high temperature must be used as the inner electrode. As a consequence, the cost of making the device tends to increase.

Hence, for making a laminated piezoelectric device by employing a piezoelectric porcelain composition whose firing temperature exceeds 1200° C. in the piezoelectric layer while using relatively inexpensive Ag or the like for the inner electrode, it is necessary to lower the firing temperature of the piezoelectric porcelain composition by temporarily firing the piezoelectric porcelain composition and then processing it into a powder having a large specific surface area or by pressurizing the laminate at the time of final firing, for example. As a result, the making of the piezoelectric device has been quite complicated in terms of its procedure.

When lowering the firing temperature by adding an Ag compound such as Ag or Ag oxide to the piezoelectric porcelain composition alone, on the other hand, the amount by which the Ag compound can dissolve into piezoelectric crystals constituted by the piezoelectric porcelain composition is about 0.12 mol % in terms of $Ag_2O$. Therefore, when an excessive amount of the Ag compound is added to the piezoelectric porcelain composition, an insoluble part of Ag may remain in crystal grain boundaries of the piezoelectric layer, thereby causing silver migrations. In this case, the insulating resistance of the piezoelectric layer tends to decrease in a moisture resistance load reliability test, for example.

Also, the piezoelectric porcelain compositions where only Mo compound such as Mo or Mo oxide is added has been problematic in that the Mo compound may combine with Ag constituting the inner electrode, thus lowering the ratio of electrically conductive substances in the inner electrode, thereby decreasing the dielectric constant.

When generating a laminated piezoelectric device or the like by using a conventional piezoelectric porcelain composition, local deformations may occur because of the difference between the respective contraction ratios of the inner electrode and piezoelectric layer at the time of firing.

In a laminated piezoelectric device having a piezoelectric layer which comprises a above mentioned piezoelectric porcelain composition where a substance such as Ag is added, a curve indicating a volume contraction ratio with respect to firing time (contraction curve) in the firing reaction tends to become steep. Also, it is not easy to regulate a temperature profile for eliminating the steepness of the contraction curve. Hence, the balance of contraction between the inner electrode and piezoelectric layer is hard to control at the time of firing. When forming a thin laminated piezoelectric device with a relatively large area in particular, warpage, undulation, and the like occur in thus obtained device.

Meanwhile, when forming a piezoelectric device, a piezoelectric porcelain composition for constituting a piezoelectric layer often contains not only the above-mentioned complex oxide and additional substances, but also a binder for making it easier to form layers. In this case, it is necessary to carry out two steps of debindering and firing when forming the device. In such two steps, the debindering is initially carried out in an open atmosphere in order to promote the scattering of the binder. Thereafter, for preventing elements (mainly Pb) contained in the piezoelectric porcelain composition from evaporating, the debindered device is transferred into a sealed container and then is fired.

Even when the above-mentioned conventional piezoelectric porcelain composition can realize a firing temperature which is low to a certain extent, thereby somewhat simplifying the process of making the piezoelectric device, a complicated procedure such as that mentioned above is still required in the making of the piezoelectric device. Hence, there has been a demand for a piezoelectric porcelain composition which can further simplify the process of making the piezoelectric device.

In view of such circumstances, it is an object of the present invention to provide a new piezoelectric porcelain composition which can use inexpensive Ag in an inner electrode of a laminated piezoelectric device while yielding a favorable piezoelectric characteristic after firing. It is another object of the present invention to provide a method of making this piezoelectric porcelain composition, a piezoelectric device and a method of making the same, and a piezoelectric body.

For achieving the above-mentioned objects, the present invention provides a piezoelectric porcelain composition containing a complex oxide having a perovskite structure mainly composed of Pb, Zr and Ti; and the following component (a) and/or (b):
  (a) Ag and/or an Ag compound, and Mo and/or an Mo compound
  (b) silver molybdate [$Ag_2MoO_4$]

A preferred example of the piezoelectric porcelain composition having such a configuration is one which is made by adding Ag and/or an Ag compound, and Mo and/or an Mo compound to a complex oxide having a perovskite structure mainly composed of Pb, Zr and Ti, and contains a silver molybdate [$Ag_2MoO_4$]. Namely, preferred is a piezoelectric porcelain composition which is made by adding Ag and Mo as metals or compounds thereof to a complex oxide having a perovskite structure mainly composed of Pb, Zr and Ti, and contains silver molybdate [$Ag_2MoO_4$].

The piezoelectric porcelain composition having such a composition allows the firing for forming the piezoelectric device to be carried out at a temperature lower than that for conventional piezoelectric porcelain compositions. Since silver molybdate is characteristically quite stable in the composition, it rarely causes piezoelectric characteristics and moisture resistance reliability to deteriorate, which has been a problem in the case where Ag or Mo is added alone.

Enabling the firing of the piezoelectric porcelain composition under a low temperature condition is preferred not only from the viewpoint of making it possible to overcome the above-mentioned problems of raising the cost for manufacturing the piezoelectric device and complicating the manufacturing procedure, but also from the following reason. Recently, in piezoelectric actuators which are laminated piezoelectric devices, silver/palladium alloys (Ag—Pd alloys) have often been used as a material for the inner electrode, since they are relatively inexpensive and excellent in characteristics such as heat resistance. However, it has been known that, if the Pd content exceeds 30 mass % in an electrode made of such an alloy, the Pd reducing reaction tends to occur during the firing. In this case, cracks may occur in the piezoelectric layer of the device, or the electrode may peel off. Therefore, it is preferred that the Pd content be 30 mass % or less in an electrode made of an Ag—Pd alloy. For achieving a Pd content of 30 mass % or less, the firing temperature is required to be 1150° C. or lower, preferably 1120° C. or lower, according to the constitutional diagram of Ag—Pd.

For further lowering the cost for making the device, it is preferable to decrease the content of Pd, which is relatively expensive in this alloy. The firing at a lower temperature is desired from this viewpoint as well. For making an electrode constituted by Ag alone while nullifying the Pd content, for example, the firing temperature is required to be 950° C. or lower, preferably 900° C. or lower.

The piezoelectric porcelain composition in accordance with the present invention can be fired at such a temperature of 950° C. or lower. Namely, it can be fired at a temperature of 850° C. to 950° C., which is lower than that for the conventional compositions. This can simplify the process of making the piezoelectric device. Thus fired piezoelectric device is not only excellent in piezoelectric characteristics, but also has such a characteristic that deformations of the device are small. Since the firing is possible at a low temperature as such, relatively inexpensive Ag can be used for the inner electrode when making a laminated piezoelectric device.

Though not elucidated yet, the inventors assume that the reason why characteristics of the piezoelectric device do not deteriorate notwithstanding the fact that the piezoelectric porcelain composition contains Ag lies in the following mechanism. In the piezoelectric porcelain composition having this composition, the dissolving of Ag into crystals of the piezoelectric layer starts near the firing temperature of 800° C. and completes at a temperature between 800° C. to 850° C. Here, the part of Ag immiscible in crystals of the piezoelectric layer combines with Mo concurrently contained therein, thereby forming silver molybdate. Silver molybdate has such a characteristic that it can quite stably exist in the composition or a piezoelectric body which will be explained later. Therefore, Ag, which may lower the moisture resistance load reliability when existing by itself, is in a stabilized state in the piezoelectric porcelain composition. As a result, the deterioration of characteristics attributable to Ag contained in the composition is very little.

When Ag and/or an Ag compound, and Mo and/or an Mo compound is added to a complex oxide, their contents represented by amount of $Ag_2O$ and $MoO_3$ converted from Ag and Mo, respectively, preferably satisfy all of the following expressions (i) to (iii):

$$Ag_2O \text{ amount} - MoO_3 \text{ amount} \leq 0.12 \text{ mol \%} \quad (i)$$

$$0.24 \text{ mol \%} \leq Ag_2O \text{ amount} \leq 0.48 \text{ mol \%} \quad (ii)$$

$$0.12 \text{ mol \%} \leq Mo_3O \text{ amount} \leq 0.36 \text{ mol \%} \quad (iii)$$

Namely, a preferred piezoelectric porcelain composition comprises a complex oxide having a perovskite structure mainly composed of Pb, Zr and Ti; and 0.24 mol % to 0.48 mol % of $Ag_2O$ and 0.12 mol % to 0.36 mol % of $MoO_3$ under the condition of $Ag_2O$ amount$-MoO_3$ amount$\leq 0.12$ mol % when Ag or a compound thereof is calculated as $Ag_2O$ while Mo and/or a compound thereof is calculated as $MoO_3$.

It will also be preferred if the piezoelectric porcelain composition comprises the complex oxide, and 0.12 mol % to 0.36 mol % of silver molybdate.

It will further be preferred if the piezoelectric porcelain composition further contains lead molybdate [$Pb_2MoO_5$]. For example, lead molybdate is also formed when the part of Mo having failed to combine with Ag in the reaction indicated by the above-mentioned mechanism combines with an excess of Pb or a compound thereof existing in the piezoelectric porcelain composition. As with silver molybdate mentioned above, lead molybdate can stably exist in the piezoelectric porcelain composition or in a piezoelectric body which will be explained later. As a consequence, Mo, which may lower the ratio of electrically conductive substances in the inner electrode when existing alone, is stabilized in the piezoelectric layer.

Thus, the piezoelectric porcelain composition having the above-mentioned configuration can stably contain Ag and Mo which may deteriorate piezoelectric characteristics and moisture resistance load reliability when existing by themselves, while lowering the firing temperature.

When fired at a predetermined temperature, such a piezoelectric porcelain composition becomes a piezoelectric body (fired product for a piezoelectric porcelain) applicable to a piezoelectric device. Examples of such a piezoelectric body include a piezoelectric body containing silver molybdate [$Ag_2MoO_4$], and a piezoelectric body containing silver molybdate [$Ag_2MoO_4$] and lead molybdate [$Pb_2MoO_5$].

Also, the present invention provides a piezoelectric porcelain composition containing a complex oxide having a perovskite structure mainly composed of Pb, Zr and Ti, and the following component (A) and/or (B):

(A) Ag and/or an Ag compound, Mo and/or an Mo compound, and W and/or a W compound (B) silver molybdate-tungstate [$Ag_2Mo_{(1-X)}W_XO_4$] (where X is a number from 0.3 to 0.7)

A piezoelectric porcelain composition having such a composition can lower the firing temperature at the time of forming the piezoelectric device as with the piezoelectric porcelain composition mentioned above. Silver molybdate-tungstate can stably exist in the composition or a piezoelectric body which will be explained later, and thus rarely causes the deterioration in piezoelectric characteristics and moisture resistance load reliability, which has been a problem in the case where Ag, Mo or W is added alone.

More specifically, it will be preferred if the piezoelectric porcelain composition is made by adding Ag and/or an Ag compound, Mo and/or an Mo compound, and W and/or a W compound to a complex oxide having a perovskite structure mainly composed of Pb, Zr and Ti, and the composition contains silver molybdate-tungstate [$Ag_2Mo_{(1-X)}W_XO_4$] (where X is a number from 0.3 to 0.7). Namely, a preferred piezoelectric porcelain composition is one which is made by adding Ag, Mo and W as metals or compounds thereof to a complex oxide having a perovskite structure mainly composed of Pb, Zr and Ti, and contains silver molybdate-tungstate [$Ag_2Mo_{(1-X)}W_XO_4$](where X is a number from 0.3 to 0.7).

Thus obtained piezoelectric porcelain composition can lower the firing temperature by about 100° C. as compared with that of a composition not containing Ag and/or an Ag compound, Mo and/or an Mo compound, and W and/or a W compound. Though the mechanism lowering the firing temperature as such is not completely clear, the inventors infer as follows:

In the composition made by adding Ag and/or an Ag compound, Mo and/or an Mo compound, and W and/or a W compound to a complex oxide having a perovskite structure mainly composed of Pb, Zr and Ti, Ag and (Mo+W) seem to form a liquid phase, which promotes a sintering reaction, thereby lowering the firing temperature.

The inventors studied the addition of the W compound and, as a result, have attained the following knowledge. Namely, it has been verified that, though an addition of W or a compound thereof to a piezoelectric porcelain composition promotes the sintering reaction at the time of sintering so that a sufficient porcelain density is obtained, an addition of W only is likely to inhibit particles from growing at the time of firing, whereby the resulting piezoelectric porcelain composition fails to yield sufficient characteristics upon firing at a low temperature.

By contrast, though the piezoelectric porcelain composition having the above-mentioned composition contains W which is likely to yield such inconveniences and Ag which may lower the moisture resistance load reliability of the piezoelectric device in the composition, it rarely incur the inconveniences caused by their addition. Though not completely clear, the reason therefor is presumed to lie in the following mechanism.

In the above-mentioned piezoelectric porcelain composition containing Ag, Mo, and W in combination, the dissolving of Ag into crystals of the piezoelectric layer starts near the firing temperature of 800° C. and completes at a temperature between 800° C. to 850° C. Here, the part of Ag not completely dissolved into crystals of the piezoelectric layer recombines with (Mo+W) forming a liquid phase and so forth, thereby forming silver molybdate-tungstate. Silver molybdate-tungstate is a compound which can quite stably exist in the piezoelectric porcelain composition or a piezoelectric body which will be explained later. Therefore, Ag and W in the piezoelectric layer attain a stabilized state in the composition and thus rarely cause the above-mentioned inconveniences.

When the piezoelectric porcelain composition having such characteristics is used for making a laminated piezoelectric device, firing at a low temperature is possible, whereby relatively inexpensive Ag can be used for inner electrodes. Also, since this piezoelectric porcelain composition contains three components of Ag, Mo, and W in combination, the contraction curve caused by the sintering reaction does not show so much steepness. This can restrain warpage and undulation from occurring when forming a laminated device. Further, since the evaporation of Pb can be suppressed at the time of firing, the manufacturing process can greatly be simplified. Thus manufactured laminated piezoelectric device is excellent in piezoelectric characteristics, while its stability is high and deformations after firing are small.

When yielding a piezoelectric porcelain composition by adding Ag and/or an Ag compound, Mo and/or an Mo compound, and W and/or a W compound to the complex oxide, it will be preferred if their added amount satisfy all of the following expressions (1) to (3) when Ag, Mo, and W are calculated as $Ag_2O$, $MoO_3$, and $WO_3$, respectively:

$$Ag_2O \text{ amount}-((1-X)\cdot MoO_3+X\cdot WO_3) \text{ amount} \leq 0.12 \text{ mol \%} \quad (1)$$

$$0.24 \text{ mol \%} < Ag_2O \text{ amount} \leq 0.48 \text{ mol \%} \quad (2)$$

$$0.12 \text{ mol \%} \leq (Mo_3O+WO_3) \text{ amount} \leq 0.36 \text{ mol \%} \quad (3)$$

where X is a number from 0.3 to 0.7.

It will also be preferred if the piezoelectric porcelain composition containing the complex oxide and silver molybdate-tungstate is one which comprises the above-mentioned complex oxide; and 0.12 mol % to 0.36 mol % of silver molybdate-tungstate [$Ag_2Mo_{(1-X)}W_XO_4$](where X is a number from 0.3 to 0.7).

It will further be preferred if the piezoelectric porcelain composition having this configuration further comprises lead molybdate-tungstate [$Pb_2Mo_{(1-X)}W_XO_4$](where X is a number from 0.3 to 0.7). Lead molybdate-tungstate is also formed when the part of Mo and W having failed to combine with Ag in the reaction indicated by the above-mentioned mechanism combines with an excess of Pb or a compound thereof existing in the piezoelectric porcelain composition. Thus, Mo and W, which may lower the ratio of electrically conductive substances in the inner electrode when existing by themselves, are stabilized in the piezoelectric layer. This further improves the stability of the resulting piezoelectric device.

These piezoelectric porcelain compositions, as with those mentioned above, become piezoelectric bodies when fired at a predetermined temperature. Examples of such piezoelectric bodies include a piezoelectric body containing silver molybdate-tungstate [$Ag_2Mo_{(1-X)}W_XO_4$](where X is a number from 0.3 to 0.7), and a piezoelectric body containing silver molybdate-tungstate [$Ag_2Mo_{(1-X)}W_XO_4$](where X is a number from 0.3 to 0.7) and lead molybate-tungstate [$Pb_2Mo_{(1-X)}W_XO_4$](where X is a number from 0.3 to 0.7).

More preferably, in the piezoelectric porcelain composition of the present invention, the complex oxide further contains Zn, Mg and Nb. A preferred example of complex oxides composed of these elements is $aPb(Zn_{1/3}Nb_{2/3})O_3$-$bPb(Mg_{1/3}Nb_{2/3})O_3$-$cPbTiO_3$-$dPbZrO_3$ (where $a+b+c+d=1$).

The present invention provides a single-plate piezoelectric device in which the piezoelectric porcelain compositions in accordance with the present invention are suitably used for a piezoelectric layer. This single-plate piezoelectric device comprises two electrodes opposing each other, and a piezoelectric layer disposed between the electrodes; wherein the piezoelectric layer comprises any of the piezoelectric porcelain compositions in accordance with the present invention.

The present invention provides a laminated piezoelectric device comprising an inner electrode, a piezoelectric layer, and an outer electrode, wherein the inner electrode and the piezoelectric layer are laminated alternately, and the inner electrode is connected to the outer electrode, and wherein the piezoelectric layer comprises any of the piezoelectric porcelain compositions in accordance with the present invention.

Thus configured single-plate or laminated piezoelectric device can be made at a lower firing temperature, since the piezoelectric layer comprises any of the piezoelectric porcelain compositions in accordance with the present invention. As a consequence, the piezoelectric device can be made by a simple manufacturing process. Further, since an electrode comprising Ag can be used as the inner electrode, the cost for manufacture decreases.

Also preferred as the laminated piezoelectric device is one comprising an inner electrode, a piezoelectric layer, and an outer electrode, wherein the inner electrode and the piezoelectric layer are laminated alternately, and the inner and outer electrodes are connected to each other via a conductor within a through hole formed in the laminating direction, and wherein the piezoelectric layer comprises any of the piezoelectric porcelain compositions in accordance with the present invention.

The piezoelectric layer in the single-plate piezoelectric device and laminated piezoelectric device may be any of the piezoelectric bodies in accordance with the present invention. The inner electrode used in the laminated piezoelectric device is preferably an electrode comprising Ag.

The present invention provides the following methods for easily making the piezoelectric porcelain compositions in accordance with the present invention. Namely, the present invention provides a method which comprises a step of forming a complex oxide having a perovskite structure by temporarily firing a material containing Pb, Zr and Ti, and a step of adding Ag and/or an Ag compound, and Mo and/or an Mo compound to the complex oxide; and a method which comprises a step of forming the complex oxide, and a step of adding silver molybdate [$Ag_2MoO_4$] to the complex oxide. These methods make piezoelectric porcelain compositions which can contain silver molybdate after firing.

Also preferred as a method of making the piezoelectric porcelain composition in accordance with the present invention is one which comprises a step of forming a complex oxide having a perovskite structure by temporarily firing a material containing Pb, Zr and Ti, and a step of adding Ag and/or an Ag compound, Mo and/or an Mo compound, and W and/or a W compound to the complex oxide; and a method which comprises a step of forming the complex oxide, and a step of adding silver molybdate-tungstate [$Ag_2Mo_{(1-X)}W_XO_4$] (where X is a number from 0.3 to 0.7) to the complex oxide. These methods make piezoelectric porcelain compositions which can contain silver molybdate-tungstate after firing.

Further, the present invention provides a method of making a piezoelectric device which comprises a step of firing the piezoelectric device precursor before final firing comprising the piezoelectric porcelain composition in accordance with the present invention at a firing temperature of 850° C. to 950° C.

DESCRIPTION OF THE PREFERRED EMBODIMENTS

Figure 1:
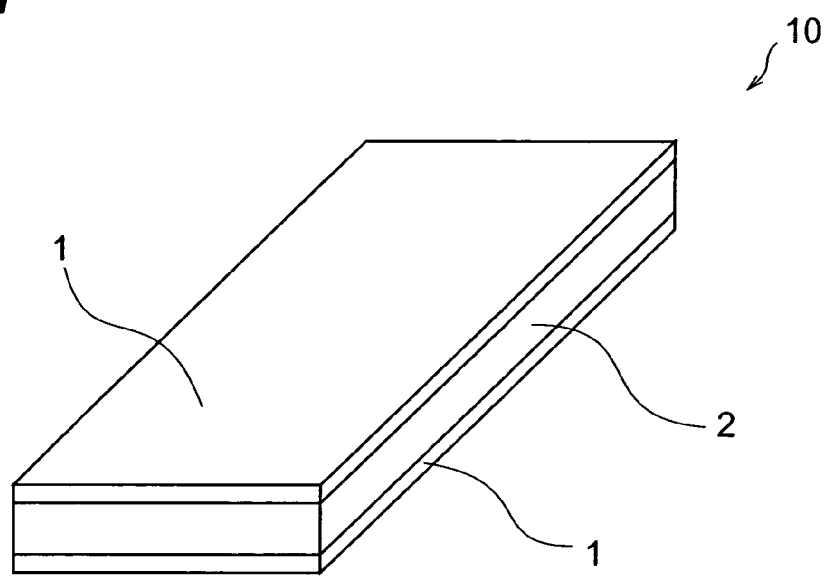
FIG. 1 is a schematic sectional view showing an embodiment of the single-plate piezoelectric device in accordance with the present invention.

In the following, preferred embodiments of the present invention will be explained with reference to the drawings. Constituents identical to each other will be referred to with numerals identical to each other without repeating their overlapping explanations. Positional relationships such as upper, lower, left, and right are based on those in the drawings.

FIG. 1 is a schematic sectional view showing an embodiment of the piezoelectric device (single-plate piezoelectric device) in accordance with the present invention. This piezoelectric device 10 comprises two electrodes 1 opposing each other, and a piezoelectric layer 2 held therebetween.

The electrodes 1 in thus configured piezoelectric device 10 may be constituted by any materials such as metals usually employed for electrodes. Examples of the materials include Ag, Au, Pt, and Pd. From the viewpoint of suppressing the manufacturing cost of the single-plate piezoelectric device 10 and the like, it is preferred that electrodes constituted by Ag—Pd alloys, which are less expensive electrode materials, or by Ag alone be used.

The piezoelectric layer 2 is constituted by a piezoelectric porcelain composition in accordance with the present invention. For example, this layer may be a piezoelectric body of the present invention formed by firing the piezoelectric porcelain composition. Examples of the piezoelectric porcelain composition constituting the piezoelectric layer 2 include the following first and second piezoelectric porcelain compositions.

The first piezoelectric porcelain composition will now be explained. The first piezoelectric porcelain composition contains a complex oxide having a perovskite structure mainly composed of Pb, Zr, and Ti, and the following component (a) and/or (b):

(a) Ag and/or an Ag compound, and Mo and/or an Mo compound (b) silver molybdate [$Ag_2MoO_4$]

In the piezoelectric porcelain composition, the component (a) and/or (b) is preferably dissolved or dispersed in the complex oxide.

Preferably, the complex oxide having a perovskite structure is an oxide further containing Zn, Mg, and Nb in addition to the main ingredients of Pb, Zr, and Ti. A specific example of such a complex oxide is $a\text{Pb}(Zn_{1/3}Nb_{2/3})O_3\text{-}b\text{Pb}(Mg_{1/3}Nb_{2/3})O_3\text{-}c\text{PbTiO}_3\text{-}d\text{PbZrO}_3$ (where $a+b+c+d=1$)

More preferably, the first piezoelectric porcelain composition further contains lead molybdate [$Pb_2MoO_5$]. This allows an excess of Mo in the composition to exist in a stable state. A preferred content of lead molybdate is 0 to 0.18 mol % with respect to the total molar amount of the complex oxide.

As mentioned above, the first piezoelectric porcelain composition contains the complex oxide and the above-mentioned component (a) and/or (b). Such a piezoelectric porcelain composition can be obtained by adding the component (a) and/or (b) to the complex oxide, for example.

When adding the component (a), it is necessary that amount of Ag and/or an Ag compound and Mo and/or an Mo compound as the composition (a) be such amounts that the fired piezoelectric porcelain composition can fully maintain its piezoelectric characteristics. To this aim, it is preferred that their amounts satisfy all of the following expressions (i) to (iii):

$$\text{Ag}_2\text{O amount} - \text{MoO}_3 \text{ amount} \leq 0.12 \text{ mol \%} \quad (i)$$

$$0.24 \text{ mol \%} \leq \text{Ag}_2\text{O amount} \leq 0.48 \text{ mol \%} \quad (ii)$$

$$0.12 \text{ mol \%} \leq \text{Mo}_3\text{O amount} \leq 0.36 \text{ mol \%} \quad (iii)$$

when the respective amounts of Ag and Mo are calculated as those of $Ag_2O$ and $MoO_3$.

When adding respective compounds of Ag and Mo, any compounds can be used with no restriction in particular as long as Ag and Mo components can be obtained by heating or the like. Examples of the compounds include oxides, carbonates, hydroxides, and nitrates of Ag and Mo. Among them, the oxides are preferred in particular. Preferred examples of oxides of Ag and Mo include $Ag_2O$ and $MoO_3$.

In the piezoelectric porcelain composition obtained by such addition, the part of Ag immiscible into crystals formed by the piezoelectric porcelain composition may combine with Mo concurrently added thereto, for example, after firing, thereby forming silver molybdate. Thus formed silver molybdate in the piezoelectric porcelain composition can be identified by x-ray diffraction or an x-ray microanalyzer. The silver molybdate content in the piezoelectric porcelain composition is preferably about 0.12 mol % to about 0.36 mol % with respect to the total number of moles of the composition.

When the component (b) is added to the complex oxide, on the other hand, it is necessary that the amount of silver molybdate be such an amount that the fired piezoelectric porcelain composition can fully maintain its piezoelectric characteristics as mentioned above. To this aim, it is preferred that the amount of silver molybdate be 0.12 mol % to 0.36 mol % with respect to the total molar amount of the complex oxide.

The second piezoelectric porcelain composition will now be explained. The second piezoelectric porcelain composition contains a complex oxide having a perovskite structure mainly composed of Pb, Zr, and Ti, and the following component (A) and/or (B):

(A) Ag and/or an Ag compound, Mo and/or an Mo compound, and W and/or a W compound (B) silver molybdate-tungstate [$Ag_2Mo_{(1-X)}W_XO_4$] (where X is a number from 0.3 to 0.7)

Preferred examples of the complex oxide used in the second piezoelectric porcelain composition include those in the first piezoelectric porcelain composition mentioned above.

More preferably, the second piezoelectric porcelain composition contains lead molybate-tungstate [$Pb_2Mo_{(1-X)}W_XO_4$] in addition to the complex oxide and silver molybdate-tungstate. This allows an excess of Mo and W in the composition to exist in a stable state. Preferably, the content of lead molybdate-tungstate is 0 to 0.18 mol % with respect to the total molar amount of the complex oxide.

Thus configured second piezoelectric porcelain composition is preferably obtained by adding the above-mentioned compound (A) and/or (B) to the complex oxide.

When adding the component (A), it is necessary that amounts of Ag and/or an Ag compound, Mo and/or an Mo compound, and W and/or a W component as the component (A) be such amounts that the added piezoelectric porcelain composition can fully maintain its piezoelectric characteristics.

In this case, it is preferred that their amounts be such as to satisfy all of the following expressions (1) to (3) when Ag, Mo, and W are calculated as $Ag_2O$, $MoO_3$, and $WO_3$, respectively:

$$\text{Ag}_2\text{O amount} - ((1-X) \cdot \text{MoO}_3 + X \cdot \text{WO}_3) \text{amount} \leq 0.12 \text{ mol \%} \quad (1)$$

$$0.24 \text{ mol \%} \leq \text{Ag}_2\text{O amount} \leq 0.48 \text{ mol \%} \quad (2)$$

$$0.12 \text{ mol \%} \leq (\text{Mo}_3\text{O} + \text{WO}_3) \text{amount} \leq 0.36 \text{ mol \%} \quad (3)$$

where X is a number from 0.3 to 0.7.

Examples of Ag, Mo, and W compounds which is added to the complex oxide include oxides, carbonates, hydroxides, and nitrates of these metals. Among them, the oxides are preferred in particular. Preferred oxides are $Ag_2O$, $MoO_3$, and $WO_3$.

It is presumed that, when the component (A) is added to the complex oxide, the part of Ag immiscible into crystals formed by the piezoelectric porcelain composition may combine with (Mo+W) forming a liquid phase in the composition, for example, after firing, thereby forming silver molybdate-tungstate. Thus formed silver molybdate-tungstate can be identified by the same means as that for the silver molybdate in the first piezoelectric porcelain composition. Here, the silver molybdate-tungstate content in the first piezoelectric porcelain composition is preferably 0.12 mol % to 0.36 mol % with respect to the total number of moles.

When the component (B) is added to the complex oxide, on the other hand, the amount of silver molybdate-tungstate as the component (B) is preferably 0.12 mol % to 0.36 mol % with respect to the total molar amount of the complex oxide. This can minimize the deterioration in characteristics of the piezoelectric porcelain composition after firing due to the addition of a molybdate-tungstate.

Figure 2:
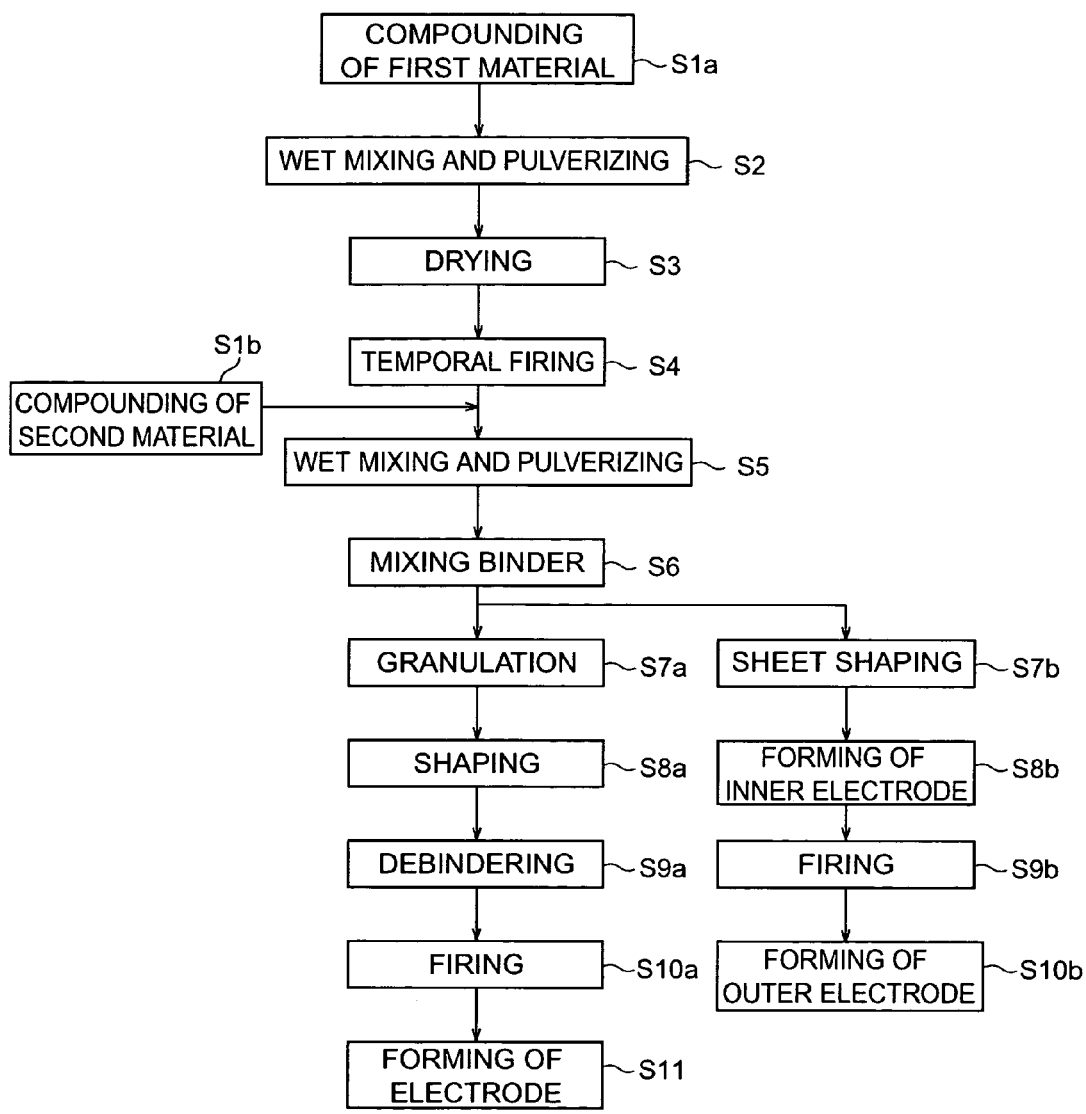
FIG. 2 is a flowchart showing a process of making a single-plate piezoelectric device in accordance with the present invention.

With reference to FIG. 2, a method of making thus configured single-plate piezoelectric device will be explained. FIG. 2 is a flowchart showing a process of making a piezoelectric device (single-plate piezoelectric device) in accordance with the present invention.

First, a material compound (first material) containing elements of Pb, Zr, and Ti are weighed and compounded so as to yield the aimed composition of complex oxide (step S1a). Employable as the first material are oxides and carbonates of the metals constituting the aimed complex oxide. When forming a complex oxide represented by $a\text{Pb}(Zn_{1/3}Nb_{2/3})O_3\text{-}b\text{Pb}(Mg_{1/3}Nb_{2/3})O_3\text{-}c\text{PbTiO}_3\text{-}d\text{PbZrO}_3$ (where a+b+c+d=1), for example, PbO, ZnO, $TiO_2$, $Nb_2O_5$, $MgCO_3$, $ZrO_2$, and the like are used as material compounds.

Subsequently, thus compounded first material is put into a ball mill, and water is added thereto. Then, with alumina balls, zirconia balls, and the like added as pulverizing media for pulverization added thereto, the resulting mixture is stirred, whereby the first material is mixed and pulverized in a wet fashion (step S2). Thus mixed and pulverized first material is dried (step S3), and then is heated for about 3 hours at a temperature of 700° C. to 900° C. so as to be temporarily fired (step S4), which causes a solid-phase reaction in the first material, thereby yielding a temporarily fired product (complex oxide).

A material compound (second material) such as the above-mentioned component (a) and/or (b), or (A) and/or (B) is weighed and added to the temporarily fired product so as to yield a desirable composition, and the temporarily fired product and the second material are compounded (step S1b), so as to form a piezoelectric porcelain composition. The addition of the second material is preferably carried out together with wet mixing and pulverizing of the piezoelectric porcelain composition which will be explained later. The second material is not always required to be added after temporarily firing the first material, but may directly be added into the first material. For minimizing undesirable compositional changes due to heating upon temporal firing and the like, however, it is preferred that the second material be added after temporal firing.

Thus obtained piezoelectric porcelain composition is mixed and pulverized in a wet fashion as in step S2 (step S5), and then a binder made of an organic substance such as polyvinyl alcohol (step S6) is added to the composition, whereby a precursor of a piezoelectric device is formed.

Subsequently, the device precursor is subjected to granulation as appropriate (step S7a), and then is shaped into a desirable device form such as a rectangular plate under a pressurized condition (step S8a). The resulting shaped article is heated to several hundred degrees (e.g., 300° C. to 500° C.) and so forth, so as to eliminate the binder (debindering; step S9a). Thus debindered product is fired at a temperature of 800° C. to 1000° C., more preferably at a temperature of 850° C. to 950° C. (step S10a), so as to form a piezoelectric body to become a piezoelectric layer 2 in the single-plate piezoelectric device 10. Then, the piezoelectric body is formed with electrodes 1 by baking, vacuum deposition, and the like (step S11), so as to yield the single-plate piezoelectric device 10. Thereafter, a predetermined polarization is generated in the piezoelectric layer 2 in thus obtained device, whereby the single-plate piezoelectric device 10 is turned into a final product.

Figure 3:
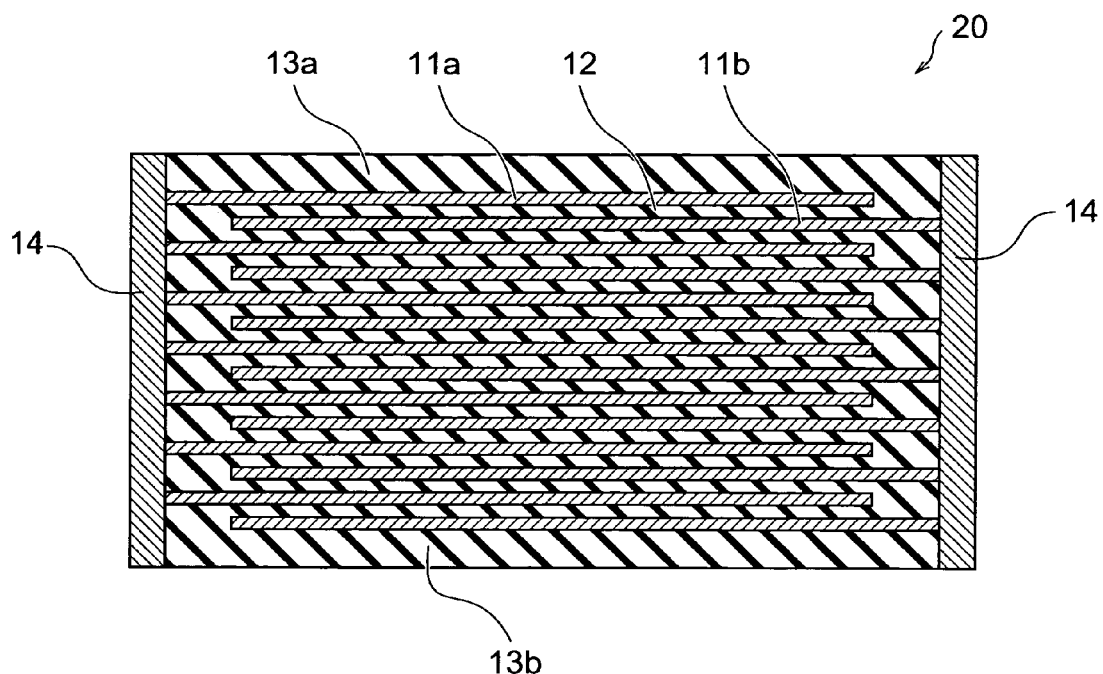
FIG. 3 is a schematic sectional view showing a first embodiment of the laminated piezoelectric device in accordance with the present invention.
Figure 4:
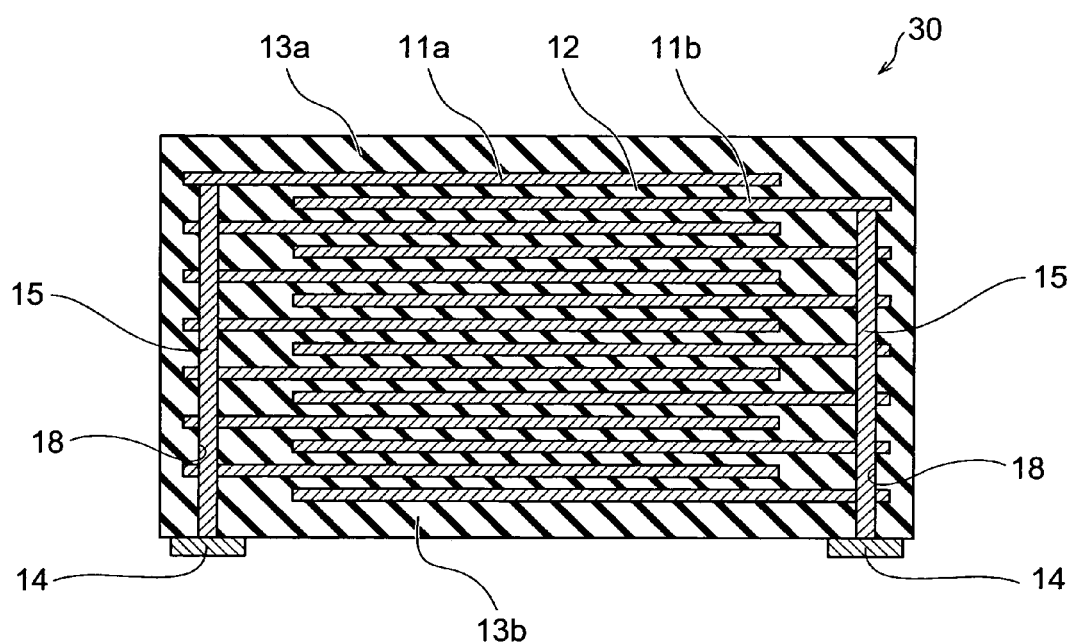
FIG. 4 is a schematic sectional view showing a second embodiment of the laminated piezoelectric device in accordance with the present invention.

With reference to FIGS. 3 and 4, preferred embodiments of the laminated piezoelectric device in accordance with the present invention will now be explained. FIG. 3 is a schematic sectional view showing a first embodiment of the laminated piezoelectric device in accordance with the present invention. The laminated piezoelectric device 20 shown in FIG. 3 comprises inner electrodes 11a, 11b alternately laminated with a piezoelectric layer 12. Protective layers 13a and 13b are disposed as the outermost layers of the laminate in which the inner electrodes 11a, 11b and the piezoelectric layer 12 are laminated. The inner electrodes 11a and 11b alternate each other, whereas outer electrodes 14 are alternately connected thereto.

Electrode materials for the inner electrodes 11a, 11b in the laminated piezoelectric device 20 are not restricted in particular as long as they are metals used for electrodes in general. From the viewpoint of lowering the cost required for making the device, however, Ag—Pd alloys and Ag, which are relatively inexpensive electrode materials are preferred. Similarly, normal electrode materials are used for the outer electrodes 14 without any restriction in particular. For example, gold electrodes formed by sputtering or the like can be used.

The piezoelectric layer 12 is constituted by the piezoelectric porcelain composition of the present invention, and is formed by firing the first and second piezoelectric porcelain compositions preferably at a temperature of 850° C. to 950° C. The protective layers 13a and 13b act to protect the laminate constituted by the inner electrodes 11a, 11b and piezoelectric layer 12, and are made of piezoelectric layers in the same composition type as that of the piezoelectric layer 12.

A method of making thus configured laminated piezoelectric device 20 will be explained with reference to FIG. 2. First, steps S1 to S6 are carried out as in the making of the single-plate piezoelectric device 10, so as to yield a precursor of the piezoelectric device. Subsequently, an organic solvent, an organic plasticizer, and the like are added to the precursor of the piezoelectric device as appropriate, and they are mixed and pulverized with a ball mill or the like, so as to yield slurry.

This slurry is applied onto a base film such as polyethylene terephthalate (PET), for example, by a known method and then is dried, so as to form a green sheet (sheet) (step S7b), which becomes the piezoelectric layer 12 after firing. Subsequently, a metal paste or the like, which is an electrode material, is applied onto the green sheet by screen printing or the like so as to yield a desirable electrode form, and then is dried, whereby an inner electrode (inner electrode 11a or 11b) is formed (step S8b). These steps S7b and S8b are repeated a plurality of times, so as to form a laminate constituted by the green sheet and inner electrodes.

Thus obtained laminate is fired at a predetermined temperature (step S9b), and then is sputtered with gold, for example, so as to form outer electrodes 14 (step S10b), and surfaces of the laminate are formed with protective layers 13a, 13b as appropriate, whereby the laminated piezoelectric device 20 is obtained.

FIG. 4 is a schematic sectional view showing a second embodiment of the laminated piezoelectric device in accordance with the present invention. The laminated piezoelectric device 30 shown in FIG. 4 comprises inner electrodes 11a, 11b alternately laminated with a piezoelectric layer 12, and protective layers 13a and 13b disposed as the outermost layers of the laminate comprising the inner electrodes 11a, 11b and piezoelectric layer 12. The laminate constituted by the inner electrodes 11a, 11b and piezoelectric layer 12 is formed with a pair of through holes 18 penetrating therethrough in the laminating direction, whereas the through holes 18 are filled with respective penetrating electrodes 15. The pair of penetrating electrodes 15 connect with their corresponding outer electrodes 14. The inner electrodes 11a, 11b and the outer electrodes 14 are electrically connected to each other via the penetrating electrodes 15. The individual parts of thus configured laminated piezoelectric device 30 are formed from substantially the same materials as those of the laminated piezoelectric device 20.

In thus configured laminated piezoelectric device 20 and laminated piezoelectric device 30, the firing temperature at the time of forming the devices can be set to about 850° C. to about 950° C., since the piezoelectric layer 2 is constituted by the piezoelectric porcelain composition of the present invention. As a consequence, electrodes constituted by relatively inexpensive Ag—Pd alloys, or preferably those constituted by Ag alone in particular, can be employed as the inner electrodes 11a, 11b, whereby the cost for making the laminated piezoelectric devices 20 and 30 can be lowered.

In the making of these piezoelectric porcelain compositions, the firing is possible under a low-temperature condition such as that mentioned above, whereby Pb in the complex oxide hardly evaporates even when the laminates are fired in the ambient atmosphere instead of a sealed container made of magnesia (MgO) or the like.

The piezoelectric porcelain composition constituting the piezoelectric layer 12 in these devices are in a state where Ag, Mo, W, and the like are uniformly dispersed, whereas their contraction curve at the time of firing does not become so steep, whereby the laminated piezoelectric devices 20 and 30 obtained after the firing hardly generate warpage, undulation, and the like.

EXAMPLES

In the following, the present invention will be explained in further detail with reference to examples, which do not restrict the present invention.

Example A

In Example A, for studying a piezoelectric porcelain composition containing a complex oxide and the above-mentioned component (a) and/or (b), the following single-plate and laminated piezoelectric devices of Samples 1 to 24 were formed, and characteristics of thus obtained devices were evaluated.

Making of Single-Plate and Laminated Piezoelectric Devices

Figure 5:
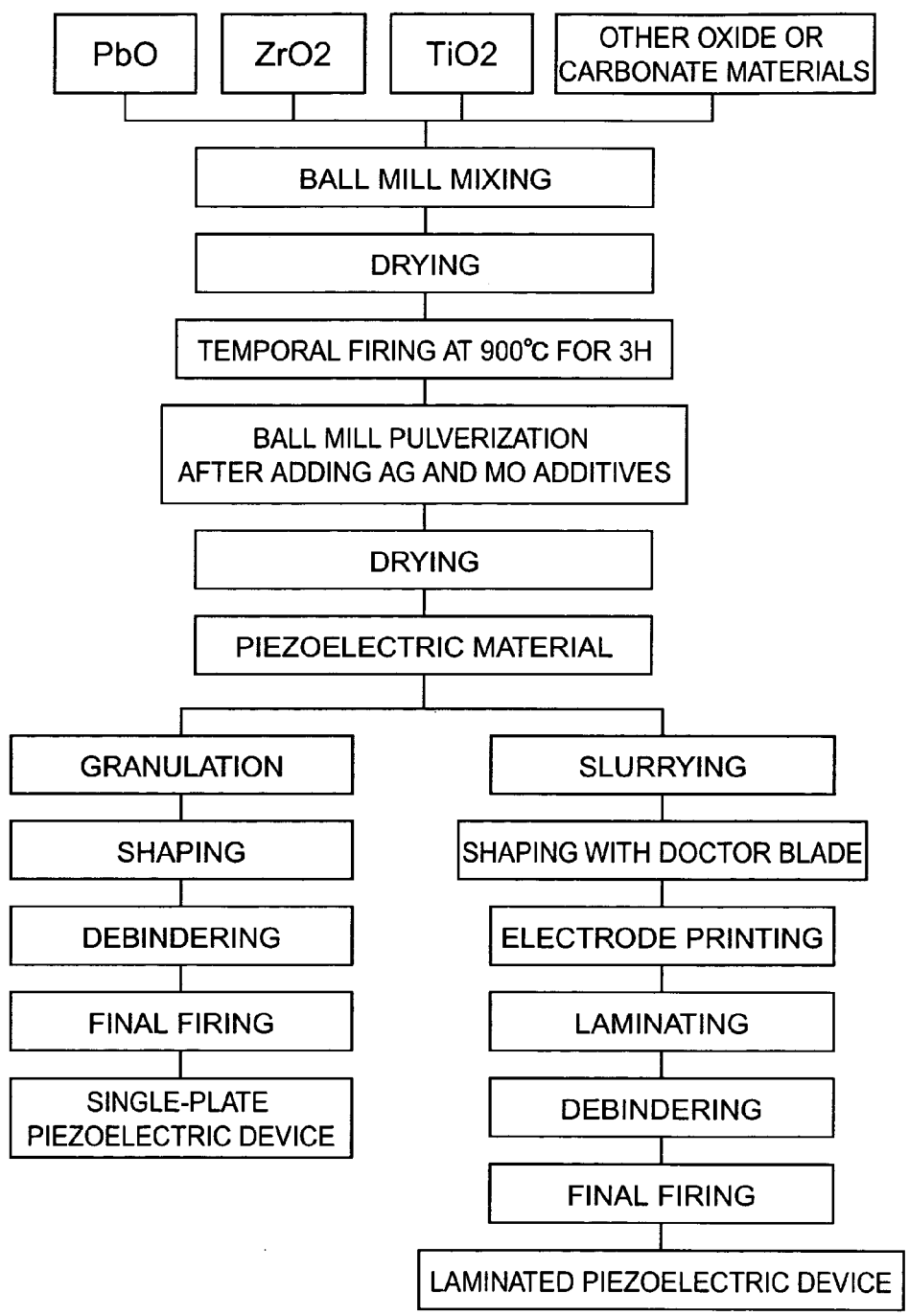
FIG. 5 is a flowchart showing the process of making a single-plate or laminated piezoelectric device in an example.

FIG. 5 is a flowchart showing a process of making a single-plate or laminated piezoelectric device in accordance with this example. First, PbO, ZnO, $Nb_2O_5$, $MgCO_3$, $TiO_2$, and $ZrO_2$ were prepared as material compounds (first materials) of a complex oxide, and were weighed and compounded so as to yield a basic composition of $0.1Pb(Zn_{1/3}Nb_{2/3})O_3$-$0.2Pb(Mg_{1/3}Nb_{2/3})O_3$-$0.38PbTiO_3$-$0.32PbZrO_3$.

They were mixed in a wet fashion with a ball mill and then were dried. Thus dried product was temporarily fired for 3 hours at 900° C., so as to yield a temporarily fired powder (temporarily fired product). This temporarily fired powder was pulverized with the ball mill again with $Ag_2O$ and $MoO_3$, or $Ag_2MoO_4$ as an additional component (second material) in conformity to the amounts (dosages) shown in Table 1. After being pulverized in a wet fashion, they were dried, whereby piezoelectric materials (piezoelectric porcelain compositions) were obtained.

Then, the following steps were carried out so as to produce a single-plate piezoelectric device. First, each of the piezoelectric materials obtained by the foregoing was granulated with a polyvinyl alcohol type binder added thereto. Then, the granulated product was shaped into a 20-mm square plate with a thickness of 1.5 mm under a pressure of about 196 MPa. Thus shaped product was debindered in the ambient atmosphere, and then was put into a sealed container made of magnesia (MgO), so that each sample was fired for 3 hours at a predetermined temperature between 800° C. to 1100° C., whereby a device body for a single-plate piezoelectric device was obtained.

Further, the porcelain density ps of the device body was determined by Archimedes' method, and then the device body was processed into a sheet having a height of 1 mm. Subsequently, thus obtained sheet-like device was formed with silver baked electrodes and then was processed into a size of 12 mm×3 mm, whereby Samples 1 to 24 of the single-plate piezoelectric device shown in FIG. 1 were produced. This single-plate piezoelectric device has a structure in which both sides of the piezoelectric layer were formed with silver baked electrodes in FIG. 1.

Next, for producing samples of the laminated piezoelectric device, the following steps were carried out. First, an organic binder, an organic solvent, and an organic plasticizer were added to each of the piezoelectric materials obtained above, and they were mixed and pulverized for 20 hours with a ball mill, so as to yield slurry.

Using this slurry, a green sheet was produced on a base film made of PET (polyethylene terephthalate) by doctor blading. Thus obtained green sheet was printed with a desirable electrode pattern by screen printing using a silver-palladium paste or silver paste, whereby an inner electrode (corresponding to the inner electrode 11a in the laminated piezoelectric device shown in FIG. 3) was formed after drying. Thereafter, the green sheet formed with the inner electrode was peeled off from the base film made of PET.

Subsequently, a green sheet was produced as mentioned above, and an electrode was printed thereon as mentioned above, whereby an inner electrode (corresponding to the inner electrode 11b in the laminated piezoelectric device shown in FIG. 3) was formed. These green sheets were laminated alternately, and then, as the outermost layers of thus obtained laminate, a plurality of layers of green sheet in the same composition system were laminated, so as to form protective layers (corresponding to the protective layers 13a, 13b in the laminated piezoelectric device shown in FIG. 3).

Thus obtained laminate was pressed together upon heating and then was cut into a predetermined chip form, whereby a green chip was formed. The green chip was subjected to debindering in the ambient atmosphere, and then was put into a sealed container, so that each sample was fired for 3 hours at a predetermined temperature between 800° C. to 1100° C., whereby a device body for a laminated piezoelectric device was obtained.

Each device body had an outer form of 30 mm (length)×6 mm (width)×about 0.36 mm (thickness) The piezoelectric layer formed from the green sheet had a thickness of 30 μm per layer. The inner electrode had a thickness of 1 μm to 2 μm per layer. The total number of inner electrodes was 10. For the inner electrodes, the piezoelectric device of Sample 1 employed an alloy in which the metal components Pd:Ag=30:70, whereas the other samples used only Ag as a metal component.

Thereafter, both end faces of each device body were formed with outer electrodes (corresponding to the outer electrodes 14 in the laminated piezoelectric device shown in FIG. 3) by sputtering with gold, whereby the laminated piezoelectric device having the structure shown in FIG. 3 was obtained. As shown in FIG. 3, the inner electrodes 11a, 11b were alternately connected to both end faces.

Evaluation of Characteristics

Using thus obtained single-plate piezoelectric devices and laminated piezoelectric devices of Samples 1 to 24, various kinds of characteristics were evaluated. Here, the single-plate piezoelectric devices and laminated piezoelectric devices were produced by the above-mentioned method by using no second material in Samples 1 and 2, using only $Ag_2O$ as the second material in Sample 3, using only $MoO_3$ as the second material in Sample 4, using $Ag_2O$ and $MoO_3$ as the second material in Samples 5 to 14, and using $Ag_2MoO_4$ as the second material in Samples 15 to 24. Each of thus obtained single-plate piezoelectric device samples was subjected to depolarization for 30 minutes at a voltage of 2 to 3 kV/mm in an insulating oil at 120° C., and then the capacitance C, resonance frequency fr, and antiresonance frequency fa of thus processed sample were measured by using an impedance analyzer. From these results, a piezoelectric strain constant $d_{31}$ was determined.

Using an LCR meter, the capacitance C was measured in each of thus obtained laminated piezoelectric devices. Then, each of the samples exhibiting a piezoelectric characteristic thereby was subjected to the following moisture resistance load reliability test. In this test, a DC electric field of 1000 kV/m was applied to the piezoelectric layer per thickness in an environment with a temperature of 60° C. and a moisture of 90% RH, and the change in ohmic value of the device with time was observed until 100 hours thereafter. For measuring the ohmic value of the device, an insulation resistance tester was used.

The results obtained by this evaluation of characteristics were listed in Table 1. In this table, ρs, C, and $d_{31}$ indicate the porcelain density, capacitance, and piezoelectric strain constant, respectively. Here, Samples 1 and 2 are conventional examples without the components (a) and (b), whereas Samples 3 and 4 contain only one of Ag and Mo in the component (a). Hence, these samples belong to comparative examples.

of Sample 1, those whose change in capacitance and piezoelectric strain constant was 10% or less were determined particularly favorable. In the moisture resistance load reliability test, those yielding an insulating resistance of $10^6$ Ω or greater was determined particularly favorable in the following studies. Sample 2, in which the firing temperature of Sample 1 was changed to 900° C., did not sinter, whereby characteristics could not be measured.

Samples 3 and 4 were comparative examples. Sample 3 was a case where only $Ag_2O$ is added, which exceeded the amount of Ag miscible in crystals of the piezoelectric layer, 0.12 mol %, whereby the part of Ag immiscible into crystals of the piezoelectric layer lowered the insulating resistance after the moisture resistance load test, and deteriorated the moisture resistance load reliability. Sample 4 was a case where only $MoO_3$ is added, in which Mo seemed to form a compound with Ag in the inner electrodes, whereby the ratio of electrically conductive components in the inner electrodes decreased, thus lowering the capacitance.

Samples 5 to 14 were those changing the combination of amounts of $Ag_2O$ and $MoO_3$. Sample 5, in which both amounts of $Ag_2O$ and $MoO_3$ were low, were relatively short of sintering, and exhibited relatively low porcelain density, capacitance, and piezoelectric strain constant.

Samples 8 and 10 were cases where the difference between $Ag_2O$ and $MoO_3$ amounts was large. In this case,

TABLE 1

| SAMPLE NO. | ADDITIVE AND DOSAGE (mol %) | | | FIRING TEMP (° C.) | SINGLE-PLATE PIEZOELECTRIC DEVICE | | | LAMINATED PIEZOELECTRIC DEVICE | |
|---|---|---|---|---|---|---|---|---|---|
| | | | | | PORCELAIN DENSITY | CAPACITANCE | PIEZOELECTRIC DEVICE | CAPACITANCE | INSULATING RESISTANCE AFTER MOISTURE RESISTANCE LOAD TEST |
| | $Ag_2O$ | $MoO_3$ | $Ag_2MoO_3$ | | ρ s(Mg/m³) | C(pF) | $d_{31}$(pC/N) | C(µF) | (Ω) |
| 1 | 0 | 0 | 0 | 1100 | 7.80 | 670 | 230 | 1.00 | $10^8$ |
| 2 | 0 | 0 | 0 | 900 | NOT SINTERED | — | — | — | — |
| 3 | 0.36 | 0 | 0 | 900 | 7.70 | 660 | 235 | 0.98 | $10^2$ |
| 4 | 0 | 0.36 | 0 | 900 | 7.68 | 640 | 220 | 0.70 | $10^6$ |
| 5 | 0.10 | 0.06 | 0 | 900 | 6.80 | 580 | 90 | — | — |
| 6 | 0.24 | 0.12 | 0 | 900 | 7.78 | 670 | 240 | 1.02 | $10^8$ |
| 7 | 0.24 | 0.24 | 0 | 900 | 7.76 | 660 | 225 | 0.99 | $10^9$ |
| 8 | 0.36 | 0.12 | 0 | 900 | 7.74 | 640 | 220 | 0.96 | $10^3$ |
| 9 | 0.36 | 0.24 | 0 | 900 | 7.80 | 680 | 220 | 0.98 | $10^9$ |
| 10 | 0.48 | 0.24 | 0 | 900 | 7.76 | 660 | 225 | 1.01 | $10^4$ |
| 11 | 0.24 | 0.36 | 0 | 900 | 7.75 | 640 | 225 | 0.97 | $10^9$ |
| 12 | 0.36 | 0.36 | 0 | 900 | 7.72 | 630 | 220 | 0.99 | $10^9$ |
| 13 | 0.48 | 0.36 | 0 | 900 | 7.71 | 620 | 210 | 0.95 | $10^8$ |
| 14 | 0.48 | 0.48 | 0 | 900 | 7.68 | 570 | 155 | — | — |
| 15 | 0 | 0 | 0.06 | 900 | 6.75 | 550 | 110 | — | — |
| 16 | 0 | 0 | 0.12 | 900 | 7.74 | 650 | 235 | 0.97 | $10^8$ |
| 17 | 0 | 0 | 0.24 | 900 | 7.78 | 660 | 235 | 1.02 | $10^{10}$ |
| 18 | 0 | 0 | 0.36 | 900 | 7.72 | 650 | 230 | 0.99 | $10^9$ |
| 19 | 0 | 0 | 0.40 | 900 | 7.69 | 590 | 160 | — | — |
| 20 | 0 | 0 | 0.24 | 800 | 6.70 | 420 | 80 | — | — |
| 21 | 0 | 0 | 0.24 | 850 | 7.74 | 640 | 225 | 1.00 | $10^8$ |
| 22 | 0 | 0 | 0.24 | 920 | 7.71 | 660 | 240 | 1.05 | $10^{10}$ |
| 23 | 0 | 0 | 0.24 | 950 | 7.72 | 660 | 235 | 1.02 | $10^9$ |
| 24 | 0 | 0 | 0.24 | 1000 | 7.72 | 660 | 240 | 0.31 | — |

Sample 1 was obtained by firing a basic piezoelectric porcelain composition at 1100° C. Since problems may occur in terms of product characteristics if the capacitance and piezoelectric strain constant of a piezoelectric device change by 10% or more with reference to the characteristics the part of Ag obtained by subtracting the amount of Mo from the amount of Ag dissolved into crystals of the piezoelectric layer tended to remain without becoming miscible, whereby the insulating resistance after the moisture load reliability test became relatively low. In Sample 14, the amount of additive (MoO$_3$ in particular) was in excess, whereby the piezoelectric strain characteristic deteriorated.

From the foregoing, the range where Ag$_2$O is 0.24 mol % to 0.48 mol %, MoO$_3$ is 0.12 mol % to 0.36 mol %, and the value obtained when subtracting the MoO$_3$ amount from the Ag$_2$O amount is 0.12 mol % or less has been found preferable in particular.

Samples 15 to 24 were samples where Ag$_2$MoO$_4$ is added. Sample 15, in which the amount was relatively small, was somewhat short of sintering. By contrast, Sample 19 was a case with a large amount, and exhibited a relatively low piezoelectric strain characteristic. From these results, it has been found that the amount of Ag$_2$MoO$_4$ is preferably within the range of 0.12 mol % to 0.36 mol % in particular.

Samples 20 to 24 were cases changing the firing temperature. Sample 20, whose firing temperature was 800° C., was somewhat short of sintering. Sample 24 was fired at 1000° C., which was higher than the melting point of the inner electrode component Ag, whereby the inner electrodes melted, so as to become a cluster of island electrodes partly aggregated by surface tension, thereby lowering the capacitance. This has verified that the firing temperature preferably ranges from 850° C. to 950° C.

Example B

In Example B, for studying a piezoelectric porcelain composition containing a complex oxide and the above-mentioned component (A) and/or (B), single-plate and laminated piezoelectric devices of Samples 25 to 52 shown in the following were formed, and characteristics of thus obtained devices were evaluated.

Making of Single-Plate and Laminated Piezoelectric Devices

The single-plate and laminated piezoelectric devices of Samples 25 to 52 were made as in the making of single-plate and laminated piezoelectric devices in Example A except that three kinds of oxides of Ag$_2$O, MoO$_3$, and WO$_3$, or Ag$_2$(Mo$_{0.5}$W$_{0.5}$)O$_4$ was weighed and added according to the amounts shown in Table 2 or so as to yield the compositions shown in Table 3. For the inner electrodes, the piezoelectric device of Sample 25 employed an alloy in which the metal components Pd:Ag=30:70, whereas the other samples used only Ag as a metal component.

Evaluation of Characteristics

Using thus obtained single-plate piezoelectric devices and laminated piezoelectric devices of Samples 25 to 52, various kinds of characteristics were evaluated. Here, the single-plate piezoelectric devices and laminated piezoelectric devices were produced by the above-mentioned method by using no second material in Samples 25 and 26, using only Ag$_2$O as the second material in Sample 27, using only MoO$_3$ and WO$_3$ as the second material in Sample 28, using Ag$_2$O, MoO$_3$, and WO$_3$ as the second material in Samples 29 to 38, using Ag$_2$(Mo$_{0.5}$W$_{0.5}$)O$_4$ as the second material in Samples 39 to 48, and using Ag$_2$Mo$_{(1-X)}$W$_X$O$_4$ (where X is 0, 0.3, 0.7, or 1) as the second material in Samples 49 to 52. Each of thus obtained single-plate piezoelectric device sample was subjected to depolarization for 30 minutes at a voltage of 2 to 3 kV/mm in an insulating oil at 120° C., and then the capacitance C, resonance frequency fr, and antiresonance frequency fa of thus processed sample were measured by using an impedance analyzer. From these results, a piezoelectric strain constant d$_{31}$ was determined.

Using an LCR meter, the capacitance C was measured in each of thus obtained laminated piezoelectric devices. Then, each of the samples exhibiting a characteristic thereby was subjected to the following moisture resistance load reliability test. In this test, a DC electric field of 1000 kV/m was applied to the piezoelectric layer per thickness in an environment with a temperature of 60° C. and a moisture of 90% RH, and the change in ohmic value of the device with time was observed until 100 hours thereafter. For measuring the ohmic value of the device, an insulation resistance tester was used.

Further, using the piezoelectric devices of Samples 49 to 52, warpage generated in the devices was evaluated. The warpage was evaluated by using a laser type three-dimensional form measuring apparatus (made by Japan Digitec Co., Ltd.), and the devices exhibiting a total warpage amount of 50 μm or less were determined favorable, whereas those exhibiting a total warpage amount exceeding 50 μm were determined defective.

The results obtained by this evaluation of characteristics were listed in Tables 2 and 3. In these tables, ρs, C, and d$_{31}$ indicate the porcelain density, capacitance, and piezoelectric strain constant, respectively. Here, Samples 25 and 26 are conventional examples, and belong to comparative examples since they do not contain metals or compounds of Ag, Mo, and W. Samples 27 and 28 belong to comparative examples since they contain only one of Ag$_2$O and (MoO$_3$+WO$_3$).

TABLE 2

| | ADDITIVE AND DOSAGE (mol %) | | | FIRING | SINGLE-PLATE PIEZOELECTRIC DEVICE | | |
|---|---|---|---|---|---|---|---|
| | | | | | PORCELAIN | | PIEZOELECTRIC STRAIN |
| SAMPLE NO. | Ag$_2$O | (0.5MoO$_3$ + 0.5WO$_3$) | Ag$_2$Mo$_{0.5}$W$_{0.5}$O$_4$ | TEMP. (° C.) | DENSITY ρs(Mg/m$^3$) | CAPACITANCE C(pF) | CONSTANT d$_{31}$(pC/N) |
| 25 | 0 | 0 | 0 | 1100 | 7.80 | 670 | 230 |
| 26 | 0 | 0 | 0 | 900 | NOT SINTERED | — | — |
| 27 | 0.36 | 0 | 0 | 900 | 7.70 | 660 | 235 |
| 28 | 0 | 0.36 | 0 | 900 | 7.65 | 635 | 215 |
| 29 | 0.10 | 0.06 | 0 | 900 | 6.73 | 550 | 80 |
| 30 | 0.24 | 0.12 | 0 | 900 | 7.77 | 665 | 235 |
| 31 | 0.24 | 0.24 | 0 | 900 | 7.73 | 650 | 220 |
| 32 | 0.36 | 0.12 | 0 | 900 | 7.71 | 630 | 215 |
| 33 | 0.36 | 0.24 | 0 | 900 | 7.79 | 660 | 215 |

TABLE 2-continued

| Sample No. | | | | Firing Temp. | Density | Capacitance | Piezoelectric Strain Constant |
|---|---|---|---|---|---|---|---|
| 34 | 0.48 | 0.24 | 0 | 900 | 7.76 | 640 | 220 |
| 35 | 0.24 | 0.36 | 0 | 900 | 7.77 | 640 | 225 |
| 36 | 0.36 | 0.36 | 0 | 900 | 7.70 | 625 | 215 |
| 37 | 0.48 | 0.36 | 0 | 900 | 7.70 | 615 | 205 |
| 38 | 0.48 | 0.48 | 0 | 900 | 7.63 | 550 | 135 |
| 39 | 0 | 0 | 0.06 | 900 | 6.70 | 525 | 100 |
| 40 | 0 | 0 | 0.12 | 900 | 7.73 | 645 | 230 |
| 41 | 0 | 0 | 0.24 | 900 | 7.79 | 650 | 230 |
| 42 | 0 | 0 | 0.36 | 900 | 7.70 | 640 | 230 |
| 43 | 0 | 0 | 0.40 | 900 | 7.66 | 575 | 145 |
| 44 | 0 | 0 | 0.24 | 800 | 6.60 | 400 | 70 |
| 45 | 0 | 0 | 0.24 | 850 | 7.75 | 630 | 220 |
| 46 | 0 | 0 | 0.24 | 920 | 7.70 | 650 | 235 |
| 47 | 0 | 0 | 0.24 | 950 | 7.72 | 650 | 235 |
| 48 | 0 | 0 | 0.24 | 1000 | 7.70 | 650 | 235 |

| | LAMINATED PIEZOELECTRIC DEVICE | |
|---|---|---|
| SAMPLE NO. | CAPACITANCE $C(\mu F)$ | INSULATING RESISTANCE AFTER MOISTURE RESISTANCE LOAD TEST $(\Omega)$ |
| 25 | 1.00 | $10^8$ |
| 26 | — | — |
| 27 | 0.98 | $10^2$ |
| 28 | 0.70 | $10^6$ |
| 29 | — | — |
| 30 | 1.02 | $10^8$ |
| 31 | 0.99 | $10^9$ |
| 32 | 0.96 | $10^3$ |
| 33 | 0.98 | $10^9$ |
| 34 | 1.01 | $10^3$ |
| 35 | 0.97 | $10^9$ |
| 36 | 0.99 | $10^9$ |
| 37 | 0.95 | $10^8$ |
| 38 | — | — |
| 39 | — | — |
| 40 | 0.97 | $10^8$ |
| 41 | 1.02 | $10^{10}$ |
| 42 | 0.99 | $10^9$ |
| 43 | — | — |
| 44 | — | — |
| 45 | 1.00 | $10^8$ |
| 46 | 1.05 | $10^{10}$ |
| 47 | 1.02 | $10^9$ |
| 48 | 0.31 | — |

TABLE 3

| | | SINGLE-PLATE PIEZOELECTRIC DEVICE | | |
|---|---|---|---|---|
| SAMPLE NO. | ADDITIVE AND DOSAGE(X) $Ag_2Mo_{1-x}W_xO_4$ (CONSTANT AT 0.24 mol %) X VALUE | FIRING TEMP. (° C.) | PORCELAIN DENSITY $\rho s (Mg/m^3)$ | CAPACITANCE $C(pF)$ | PIEZOELECTRIC STRAIN CONSTANT $d_{31}(pC/N)$ |
| 49 | 0 | 900 | 7.78 | 660 | 235 |
| 50 | 0.3 | 900 | 7.74 | 640 | 230 |
| 51 | 0.7 | 900 | 7.70 | 630 | 225 |
| 52 | 1 | 900 | 7.68 | 510 | 110 |

| | LAMINATED PIEZOELECTRIC DEVICE | | |
|---|---|---|---|
| SAMPLE NO. | CAPACITANCE $C(\mu F)$ | INSULATING RESISTANCE AFTER MOISTURE RESISTANCE LOAD TEST $(\Omega)$ | WARPAGE EVALUATION |
| 49 | 1.02 | $10^{10}$ | X |
| 50 | 0.96 | $10^9$ | ○ |
| 51 | 0.95 | $10^9$ | ○ |
| 52 | 0.75 | $10^6$ | ○ |

Sample 25 was obtained by firing a basic piezoelectric porcelain composition at 1100° C. Since problems may occur in terms of product characteristics if the capacitance and piezoelectric strain constant of a piezoelectric device change by 10% or more with reference to the characteristics of Sample 25, those whose change in capacitance and piezoelectric strain constant was 10% or less were determined particularly favorable in the following studies. In the moisture resistance load reliability test, those yielding an insulating resistance of $10^6$ Ω or greater was determined particularly favorable. Sample 26, in which the firing temperature of Sample 25 was changed to 900° C., did not sinter, whereby characteristics could not be measured.

Samples 27 and 28 were comparative examples. Sample 27 was a case where only $Ag_2O$ is added, which exceeded the amount of Ag miscible in crystals of the piezoelectric layer, 0.12 mol %, whereby the part of Ag immiscible into crystals of the piezoelectric layer lowered the insulating resistance after the moisture resistance load test, and deteriorated the moisture resistance load reliability. Sample 28 was a case where only $(0.5MoO_3+0.5WO_3)$ is added, in which Mo seemed to form a compound with Ag in the inner electrodes, whereby the ratio of electrically conductive components in the inner electrodes decreased, thus lowering the capacitance.

Samples 29 to 38 were those changing the combination of amounts of $Ag_2O$ and $(0.5MoO_3+0.5WO_3)$. Sample 29, in which both amounts of $Ag_2O$ and $(0.5MoO_3+0.5WO_3)$ were low, were relatively short of sintering, and exhibited relatively low porcelain density, capacitance, and piezoelectric strain constant.

Samples 32 and 34 were cases where the difference between $Ag_2O$ and $(0.5MoO_3+0.5WO_3)$ amounts was large. In this case, the part of Ag obtained by subtracting the amount of (Mo+W) from the amount of Ag dissolved into crystals of the piezoelectric layer tended to remain without becoming immiscible, whereby the insulating resistance after the moisture load reliability test became relatively low. In Sample 38, the amount of additive ($MoO_3$ in particular) was much greater than in the others, whereby the piezoelectric strain characteristic relatively deteriorated.

From the foregoing, the range where $Ag_2O$ is 0.24 mol % to 0.48 mol %, $(0.5MoO_3+0.5WO_3)$ is 0.12 mol % to 0.36 mol %, and the value obtained when subtracting the $(0.5MoO_3+0.5WO_3)$ amount from the $Ag_2O$ amount is 0.12 mol % or less has been found preferable in particular.

Samples 39 to 48 were samples where silver molybdate-tungstate $[Ag_2(Mo_{0.5}W_{0.5})O_4]$ is added. Sample 39, in which the amount was relatively small, was somewhat short of sintering. By contrast, Sample 43 was a case with a large amount, and exhibited a relatively low piezoelectric strain characteristic. From these results, it has been found that the amount of $Ag_2(Mo_{0.5}W_{0.5})O_4$ is preferably within the range of 0.12 mol % to 0.36 mol % in particular.

Samples 44 to 48 were cases changing the firing temperature. Sample 44, whose firing temperature was 800° C., was somewhat short of sintering. Sample 48 was fired at 1000° C., which was higher than the melting point of the inner electrode component Ag, whereby the inner electrodes melted, so as to become a cluster of island electrodes partly aggregated by surface tension, thereby relatively lowering the capacitance. This has verified that the firing temperature preferably ranges from 850° C. to 950° C.

Figure 6:
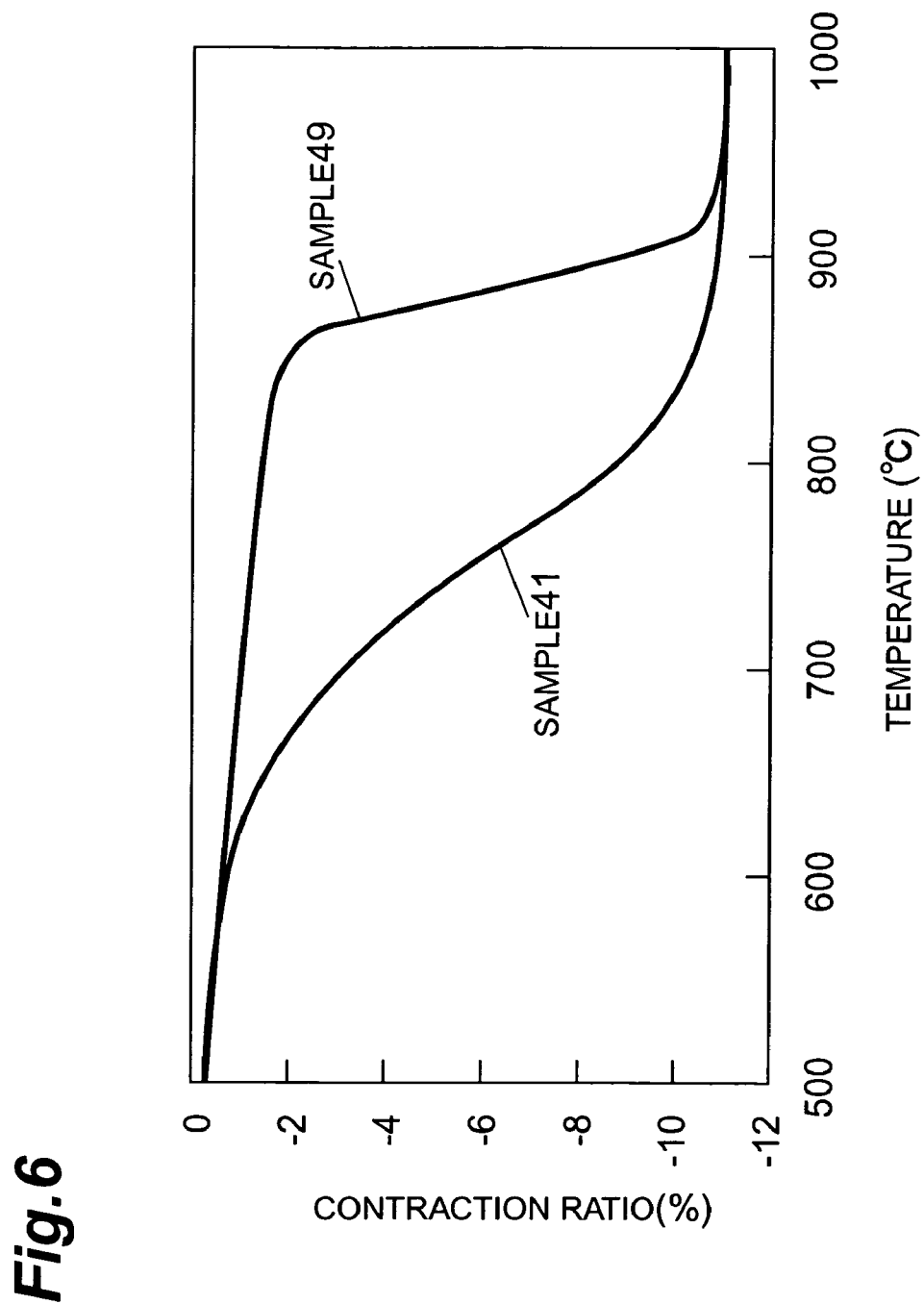
FIG. 6 is a graph showing results of shrinking behaviors in shaped products of Samples 41 and 42 investigated by a thermal analyzer.

In Table 3, Sample 49 was a case where X=0, i.e., without W. Though favorable characteristics were obtained, the amount of warpage in the device after firing was large. FIG. 6 is a graph showing results obtained when shaping Sample 49 (device of a comparative example containing no W) and Sample 41 (device of an example) and then investigating their shrinking behaviors with a thermal analyzer. As shown in FIG. 6, shrinkage was relatively moderate from 500° C. to 900° C. in the case with W (Sample 41), whereas a drastic shrinkage was seen from near 900° C. in the case without W (Sample 49).

Samples 50 and 51, in which X=0.3 and X=0.7, respectively, yielded favorable effects in each characteristic. Sample 52 was a case where X=1, i.e., without Mo. Though sintering was seen, this sample yielded low dielectric constant and piezoelectric characteristic ($d_{31}$) and inferior in each characteristic. As a consequence, it has been found necessary for X in silver molybdate-tungstate represented by $Ag_2Mo_{(1-x)}W_xO_4$ contained in the piezoelectric porcelain composition to fall within the range from 0.3 to 0.7.

The present invention can provide a piezoelectric porcelain composition which exhibits favorable piezoelectric strain and capacitance characteristics, a high moisture load reliability, and less warpage and undulation occurring in the device after firing. This piezoelectric porcelain composition makes it possible to use inexpensive Ag for inner electrodes of a laminated piezoelectric device. In addition, the piezoelectric porcelain composition deforms less after firing, and restrains Pb from evaporating, whereby the process of making can be simplified. Also, a piezoelectric device using the same and their methods of making can be provided.

What is claimed is:

1. A piezoelectric porcelain composition comprising:
   a complex oxide having a perovskite structure mainly composed of Pb, Zr and Ti; and
   at least of the following components (a) and (b), wherein
   (a) is at least one of Ag and an Ag compound, and at least one of Mo and an Mo compound; and wherein
   (b) is silver molybdate $[Ag_2MoO_4]$.

2. A piezoelectric porcelain composition according to claim 1,
   wherein the composition further comprises lead molybdate $[Pb_2MoO_5]$.

3. A piezoelectric porcelain composition according to claim 1,
   wherein the complex oxide further comprises Zn, Mg and Nb.

4. A piezoelectric porcelain composition according to claim 1,
   wherein the complex oxide is $aPb(Zn_{1/3}Nb_{2/3})O_3$-$bPb(Mg_{1/3}Nb_{2/3})O_3$-$cPbTiO_3$-$dPbZrO_3$ (where a+b+c+d=1).

5. A piezoelectric body formed by firing the piezoelectric porcelain composition according to claim 1,
   wherein the piezoelectric body comprises silver molybdate $[Ag_2MoO_4]$.

6. A single-plate piezoelectric device comprising, two electrodes opposing each other, and a piezoelectric layer disposed between the electrodes,
   wherein the piezoelectric layer comprises the piezoelectric body according to claim 5.

7. A laminated piezoelectric device comprising, an inner electrode, a piezoelectric layer, and an outer electrode,
   wherein the inner electrode and the piezoelectric layer are laminated alternately, and the inner electrode is connected to the outer electrode, and
   wherein the piezoelectric layer comprises the piezoelectric body according to claim 5.

8. A laminated piezoelectric device comprising, an inner electrode, a piezoelectric layer, and an outer electrode,
   wherein the inner electrode and the piezoelectric layer are laminated alternately, and the inner and outer electrodes are connected to each other via a conductor within a through hole formed in the laminating direction, and wherein the piezoelectric layer comprises the piezoelectric body according to claim 5.

9. A piezoelectric body formed by firing the piezoelectric porcelain composition according to claim 1,
wherein the piezoelectric body comprises silver molybdate [$Ag_2MoO_4$] and lead molybdate [$Pb_2MoO_5$].

10. A single-plate piezoelectric device comprising, two electrodes opposing each other, and a piezoelectric layer disposed between the electrodes,
wherein the piezoelectric layer comprises the piezoelectric porcelain composition according to claim 1.

11. A laminated piezoelectric device comprising, an inner electrode, a piezoelectric layer, and an outer electrode,
wherein the inner electrode and the piezoelectric layer are laminated alternately, and the inner electrode is connected to the outer electrode, and
wherein the piezoelectric layer comprises the piezoelectric porcelain composition according to claim 1.

12. A laminated piezoelectric device according to claim 11,
wherein the inner electrode comprises Ag.

13. A laminated piezoelectric device comprising, an inner electrode, a piezoelectric layer, and an outer electrode,
wherein the inner electrode and the piezoelectric layer are laminated alternately, and the inner and outer electrodes are connected to each other via a conductor within a through hole formed in the laminating direction, and
wherein the piezoelectric layer comprises the piezoelectric porcelain composition according to claim 1.

14. A method of making a piezoelectric device which comprises:
a step of firing the piezoelectric device precursor before final firing comprising the piezoelectric porcelain composition according to claim 1 at a firing temperature of 850° C. to 950° C.

15. A piezoelectric porcelain composition comprising a complex oxide having a perovskite structure mainly composed of Pb, Zr and Ti; and at least one of the following components (A) and (B), wherein
(A) is at least one of Ag and an Ag compound, at least one of Mo and an Mo compound, and at least one of W and a W compound, and wherein
(B) is silver molybdate-tungstate [$Ag_2Mo_{(1-x)}W_xO_4$] (where X is a number from 0.3 to 0.7).

16. A piezoelectric porcelain composition according to claim 15,
wherein the composition further comprises lead molybdate-tungstate [$Pb_2Mo_{(1-x)}W_xO_4$] (where X is a number from 0.3 to 0.7).

17. A piezoelectric body formed by firing the piezoelectric porcelain composition according to claim 15,
wherein the piezoelectric body comprises silver molybdate-tungstate [$Ag_2Mo_{(1-x)}W_xO_4$] (where X is a number from 0.3 to 0.7).

18. A piezoelectric body formed by firing the piezoelectric porcelain composition according to claim 15,
wherein the piezoelectric body comprises silver molybdate-tungstate [$Ag_2Mo_{(1-x)}W_xO_4$] (where X is a number from 0.3 to 0.7) and lead molybdate-tungstate [$Pb_2Mo_{(1-x)}W_xO_4$] (where X is a number from 0.3 to 0.7).

19. A piezoelectric porcelain composition:
wherein the composition is made by adding at least one of Ag and an Ag compound, and at least one of Mo and an Mo compound to a complex oxide having a perovskite structure mainly composed of Pb, Zr and Ti, and
wherein the composition comprises silver molybdate [$Ag_2MoO_4$].

20. A piezoelectric porcelain composition comprising:
a complex oxide having a perovskite structure mainly composed of Pb, Zr and Ti; and
0.12 mol % to 0.36 mol % of silver molybdate [$Ag_2MoO_4$].

21. A piezoelectric porcelain composition,
wherein the composition is made by adding at least one of Ag and an Ag compound, and at least one of Mo and an Mo compound to a complex oxide having a perovskite structure mainly composed of Pb, Zr and Ti, and
wherein respective amount of Ag and Mo calculated as $Ag_2O$ and $MoO_3$ satisfy all of the following expressions (i) to (iii):

$Ag_2O$ amount–$MoO_3$ amount $\leq$ 0.12 mol % (i)

0.24 mol % $\leq$ $Ag_2O$ amount $\leq$ 0.48 mol % (ii)

0.12 mol % $\leq$ $Mo_3O$ amount $\leq$ 0.36 mol %. (iii)

22. A piezoelectric porcelain composition,
wherein the composition is made by adding at least one of Ag and an Ag compound, at least one of Mo and an Mo compound, and at least one of W and a W compound to a complex oxide having a perovskite structure mainly composed of Pb, Zr and Ti, and
wherein the composition comprises silver molybdate-tungstate [$Ag_2Mo_{(1-x)}W_xO_4$] (where X is a number from 0.3 to 0.7).

23. A piezoelectric porcelain composition comprising:
a complex oxide having a perovskite structure mainly composed of Pb, Zr and Ti; and
0.12 mol % to 0.36 mol % of silver molybdate-tungstate [$Ag_2Mo_{(1-x)}W_xO_4$] (where X is a number from 0.3 to 0.7).

24. A piezoelectric porcelain composition,
wherein the composition is made by adding at least one of Ag and an Ag compound, at least one of Mo and an Mo compound, and at least one of W and a W compound to a complex oxide having a perovskite structure mainly composed of Pb, Zr and Ti, and
wherein respective amount of Ag, Mo and W calculated as $Ag_2O$, $MoO_3$ and $WO_3$ satisfy all of the following expressions (1) to (3):

$Ag_2O$ amount–((1–X)·$MoO_3$+X·$WO_3$) amount $\leq$ 0.12 mol % (1)

0.24 mol % $\leq$ $Ag_2O$ amount $\leq$ 0.48 mol % (2)

0.12 mol % $\leq$ ($Mo_3O$+$WO_3$)amount $\leq$ 0.36 mol % (3)

where X is a number from 0.3 to 0.7.

25. A method of making a piezoelectric porcelain composition which comprises:
a step of forming a complex oxide having a perovskite structure by temporarily firing a material comprising Pb, Zr, and Ti; and
a step of adding at least one of Ag and an Ag compound, and at least one of Mo and an Mo compound to the complex oxide.

26. A method of making a piezoelectric porcelain composition which comprises:
a step of forming a complex oxide having a perovskite structure by temporarily firing a material comprising Pb, Zr, and Ti; and
a step of adding silver molybdate [$Ag_2MoO_4$] to the complex oxide.

27. A method of making a piezoelectric porcelain composition which comprises:

a step of forming a complex oxide having a perovskite structure by temporarily firing a material comprising Pb, Zr, and Ti; and a step of adding at least one of Ag and an Ag compound, at least one of Mo and an Mo compound, and at least one of W and a W compound to the complex oxide.

28. A method of making a piezoelectric porcelain composition which comprises:

a step of forming a complex oxide having a perovskite structure by temporarily firing a material comprising Pb, Zr, and Ti; and a step of adding silver molybdate-tungstate [$Ag_2Mo_{(1-x)}W_xO_4$] (where X is a number from 0.3 to 0.7) to the complex oxide.

* * * * *